United States Patent [19]

Eaton, Jr.

[11] Patent Number: 5,109,357
[45] Date of Patent: Apr. 28, 1992

[54] DRAM MEMORY CELL AND METHOD OF OPERATION THEREOF FOR TRANSFERRING INCREASED AMOUNT OF CHARGE TO A BIT LINE

[75] Inventor: S. Sheffield Eaton, Jr., Colorado Springs, Colo.

[73] Assignee: Ramtron Corporation, Colorado Springs, Colo.

[21] Appl. No.: 491,180

[22] Filed: Mar. 9, 1990

Related U.S. Application Data

[63] Continuation of Ser. No. 185,185, Apr. 22, 1988, abandoned.

[51] Int. Cl.$^5$ .................. G11C 7/00; G11C 11/22
[52] U.S. Cl. ..................... 365/145; 365/149; 365/222
[58] Field of Search ........... 365/145, 149, 222, 189.07, 365/117

[56] References Cited

U.S. PATENT DOCUMENTS

| | | | |
|---|---|---|---|
| 2,938,194 | 5/1960 | Anderson | 365/145 |
| 2,957,164 | 10/1960 | Long et al. | 365/145 |
| 3,232,856 | 2/1966 | Klach et al. | 204/181 |
| 3,279,947 | 10/1966 | Kaiser | 117/217 |
| 3,426,255 | 2/1969 | Heywang | 365/145 |
| 3,472,776 | 10/1969 | Derbyshire | 365/145 X |
| 4,169,258 | 9/1979 | Tannas, Jr. | 365/145 |
| 4,363,111 | 12/1982 | Heightley et al. | 365/210 |
| 4,536,785 | 8/1985 | Gibbons | 357/54 |
| 4,873,664 | 10/1989 | Eaton, Jr. | 365/222 X |
| 4,888,630 | 12/1989 | Paterson | 365/117 X |
| 4,888,733 | 12/1989 | Mobley | 365/189.07 X |
| 4,893,272 | 1/1990 | Eaton, Jr. et al. | 365/189.06 X |

OTHER PUBLICATIONS

RCA Technical Notes "Reduction of Waiting Time in Ferroelectrics" by Taylor (Apr. 3, 1969).
"Ferroelectric Crystals" by Franco Jona et al. MacMillan Co., N.Y. (1962) pp. 216, 235, 240-242, 161-169, Chpt. IV, pt. 8.
Pulvari, "Research on the Application of Ferro- and Ferrielectric Phenomena in Computer Devices" RTD Tech. Doc. RTD-TDR-634002 (1963).
Kaufman, "An Expandable Ferroelectric Random Access Memory", *IEEE Trans. on Computers*, vol. C-22, No. 2 (Feb. 1973).

Primary Examiner—Alyssa H. Bowler
Attorney, Agent, or Firm—Edward D. Manoz

[57] ABSTRACT

An improved DRAM memory cell uses ferroelectric material as the dielectric between capacitor plates. Preferably polycrystalline PZT or a perovskite is used for the ferroelectric, and the polar axes of the dipoles in the ferroelectric material in relaxed position are not aligned with the direction of the resulting electric field when voltage is applied to the capacitor plates. Preferably, the dipole orientation is in the plane of the ferroelectric film so that when a write voltage is removed from the capacitor plate, the dipoles tend to relax to a non-aligned position. When the cell is read or refreshed, increased charge is drawn from the bit line and resides on the capacitor plate in order to reorient the relaxed dipoles. The charge developed on the plate hence is magnified.

9 Claims, 1 Drawing Sheet

DRAM MEMORY CELL AND METHOD OF OPERATION THEREOF FOR TRANSFERRING INCREASED AMOUNT OF CHARGE TO A BIT LINE

This is a continuation of copending application Ser. No. 07/185,185 filed on Apr. 22, 1988 now abandoned.

FIELD OF THE INVENTION

The present invention relates to materials used in memory cells of semiconductor memories. In particular, this invention relates to a material for use as a dielectric in the memory cell of a dynamic random access memory ("DRAM").

BACKGROUND OF THE INVENTION

DRAM memory cells over the past 15 years or more have generally been of the one transistor-one capacitor variety. Basically, charge is stored in a memory cell capacitor which is selectively coupled through the source-drain path of the transistor, sometimes called an access transistor, to a bit line. The access transistor has its gate electrode coupled to a word line. When the transistor is turned on, the charge stored in the capacitor is coupled via the source-drain path to the bit line and is generally compared against some other standard, typically a dummy memory cell, so that the state of the memory cell, indicated by the charge stored in the capacitor, is determined. For example, Heightley and Eaton U.S. Pat. No. 4,363,111 entitled "Dummy Cell Arrangement For An MOS Memory" issued Dec. 7, 1982 shows a configuration of memory cells and a dummy cell together with the sense amplifiers used in an array of DRAM cells.

Typically, each generation of DRAM has increased the memory storage capacity by a factor of four. Thus, early DRAMS with 4K of memory yielded to 16K DRAMS, then 64K DRAMS, 256K DRAMS, and 1 megabit DRAMS. With each new generation of increased memory capacity, in order to control the total area of the chip, the individual memory cells have tended to shrink in area. This has the effect of reducing the capacitance of the capacitor in the cell. In the face of this trend toward memory cell shrinkage, it has always been important to preserve sufficient capacitance to store the charge which represents the data. Currently, very large DRAMS are using trench design to increase capacitor area in a small area memory cell. The manufacturing process for this technology is extremely complex. These trenches use three dimensions to increase capacitor plate area and may be on the order of 3 microns deep and 1 micron wide. A silicon dioxide dielectric is added and then a polysilicon layer is added for a top capacitor plate.

Silicon dioxide has a fairly low dielectric constant, about 4. One approach to increasing the capacitance in DRAM memory cells is to substitute a different material as the dielectric, one that would have a higher dielectric constant than silicon dioxide has. Because capacitance is directly related to both area and dielectric constant, this would improve the capacitance for a given area.

The present invention is concerned with improving the performance of DRAM memory cells by including a dielectric other than silicon dioxide.

SUMMARY OF THE INVENTION

The present invention includes a ferroelectric material as the dielectric in a DRAM memory cell capacitor. The relaxation property inherent in ferroelectric materials is employed and preferably is emphasized by using domains that are not aligned with the field created when voltage is applied to the capacitor plates. Combining this arrangement with the normal refresh operations of a DRAM augments substantially the amount of charge developed by the capacitor.

By using the relaxation property of the ferroelectric material, when such domains are chosen, significant improvements are observed in the amount of charge developed on the capacitor—in fact beyond the amount that the dielectric constant would indicate. Briefly, by using a ferroelectric material as the dielectric and conditioning it to promote relaxation, the dipoles within the ferroelectric material can be expected to align during the application of external voltage (e.g. a write pulse), then relax when the voltage is removed, and then reorient each time a read pulse is applied (such as during refresh). As a result, more charge is drawn by the memory cell from the bit line per unit area than would otherwise be expected. This charge resides on the capacitor plates.

BRIEF DESCRIPTION OF THE DRAWINGS

In describing the preferred embodiment, reference is made to accompanying drawings wherein.

DESCRIPTION OF THE PREFERRED EMBODIMENT

Figure 1:
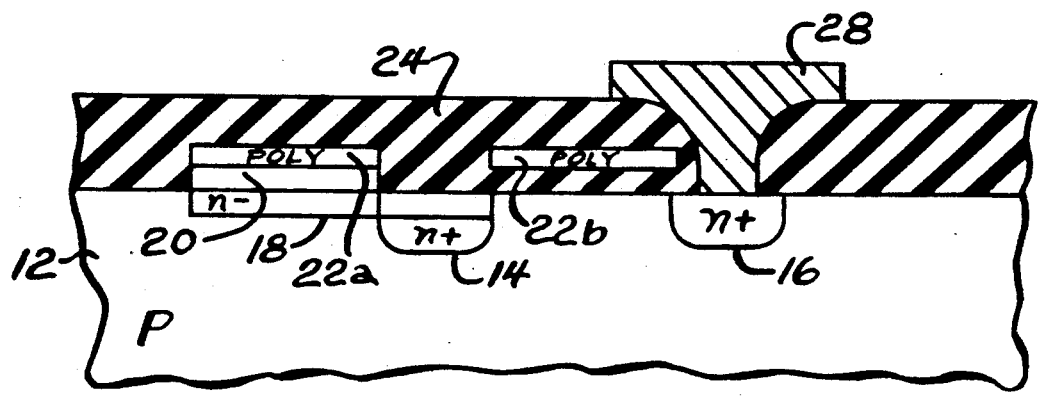
FIG. 1 represents the topography in cross section of a normal DRAM memory cell.

As shown in FIG. 1, a DRAM memory cell can be constructed in a substrate 12 of P-type silicon. A transistor and capacitor are established. Specifically, first and second diffusions 14 and 16 of N+ are established and serve as the source and drain of a field effect transistor. A diffusion region 18 of N−, shallower than diffusion 14 and intersecting it, forms one capacitor plate. Over the top of substrate 12, dielectric such as silicon dioxide 20 can be established with a doped polysilicon 22a thereover as the other capacitor plate. Also, another portion 22b of polysilicon forms the gate electrode of the transistor and is shown above substrate 12, located between the source/drain regions 14, 16, but spaced from the top surface of substrate 12 by gate oxide. A layer of silicon dioxide 24 covers polysilicon 22, and an opening 26 is established in oxide 24 to allow a metal element 28, typically aluminum, to contact diffusion 16. Element 28 represents the bit line, and element 22b represents a word line in an array of such DRAM cells.

The dielectric 20 between conductive members 22a and 18 is silicon dioxide which, as mentioned, has a dielectric constant of about 4.

Figure 2:
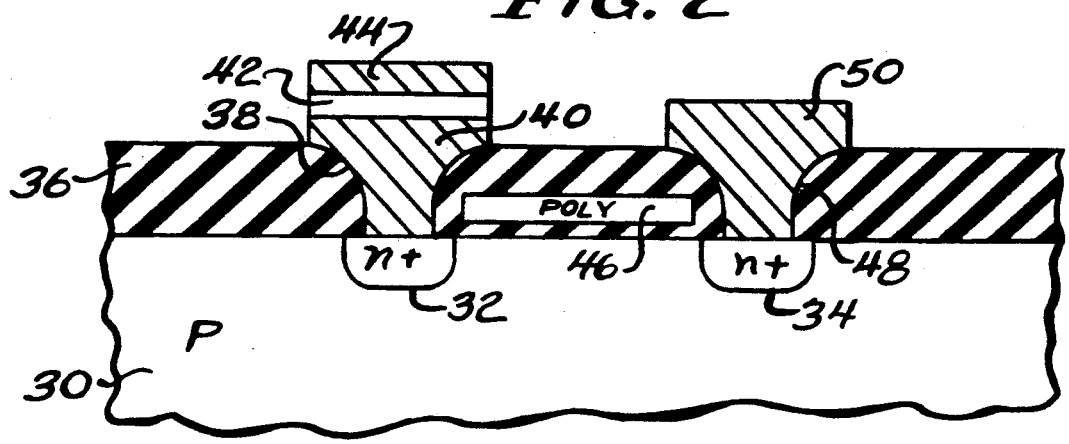
FIG. 2 represents the topography in cross section of a DRAM memory cell constructed in accordance with aspects of the present invention.

FIG. 2 illustrates a structure in which the present invention can be applied. While this figure uses MOS technology, it is to be understood that the present invention is not limited to MOS technology, but may extend also to gallium arsenide, for example. It includes a P-type substrate 30 of silicon or another substrate material, and includes source and drain regions formed by N+ diffusions 32 and 34. A dielectric insulation region 36 formed illustratively of silicon dioxide includes an opening 38 so that a conductive member 40 can contact diffusion 32. Conductor 40 is one capacitor plate, and is unique to each memory cell. A ferroelectric material 42 is located over conductor 40, and another conductor 44 is located over element 42 to form another capacitor plate. Conductor 44 can be a common plate line extending along a row or column in a semiconductor memory array. Conductors 40 and 44 can be formed of a metal such as gold or, preferably, platinum, or other conductive materials.

A gate electrode 46 formed illustratively of doped polysilicon is located in dielectric insulator 36 and generally between diffusions 32 and 34, but spaced apart from the top surface, of substrate 30 by gate oxide, as is customary. A further opening 48 in insulation 36 permits another conductive region 50, typically formed of aluminum, to contact diffusion 34. Region 50 can be common to a row or column of DRAM cells and serves as a bit line in the memory array.

Both FIG. 1 and FIG. 2 show memory cells in cross section having a single capacitor and single transistor. In the case of FIG. 1, the dielectric between the capacitor plates 22a and 18 is silicon dioxide, but in FIG. 2 the dielectric between capacitor plates 40 and 44 is a ferroelectric material 42. A main reason why the present invention prefers the. FIG. 2 structure over that of FIG. 1 is to avoid problems in the interface between the ferroelectric material 20 and the silicon electrodes 22a and 18 of FIG. 1. It will be seen that in FIG. 2, the ferroelectric material 42 interfaces to electrodes 40 and 44, neither of which in the preferred embodiment is composed of silicon. If the interface problems were overcome, however, then configurations other than the representative one shown in FIG. 2 could be employed—such as FIG. 1, assuming the dielectric 20 is ferroelectric.

The dielectric constant of ferroelectric materials generally will fall in the range of between 10 and 30,000. Ideal ferroelectric materials have a square hysteresis loop when plotting, applied voltage against polarization. Generally the dielectric constant is proportional to the slope of the top line. In the present invention, the objective is not simply to achieve a high dielectric constant, but to develop substantial additional charge on the capacitor per unit area. According to the present invention, the relaxation property of ferroelectric materials is put to use to achieve this objective.

Normally, the relaxation of dipoles in a ferroelectric material after switching leads to tremendous problems in memories which rely on the ferroelectric state to indicate data. If a ferroelectric material has been in a given state and then is switched to the opposite state by application of a short switching pulse of adequate voltage across the ferroelectric material, then the many of the dipoles will tend to relax back to their original positions. This ultimately can lead to the destruction of data, and in co-pending patent application Ser. No. 184,996, filed herewith, entitled "FERROELECTRIC RETENTION METHOD" now U.S. Pat. No. 4,893,272, a method is shown to overcome the relaxation problem as it relates to data retention ferroelectric memories. In the present invention, however, relaxation is promoted rather than overcome. Thus, the present invention takes advantage of the undesirable property of ferroelectric materials by putting it to a surprising use.

Figure 3:
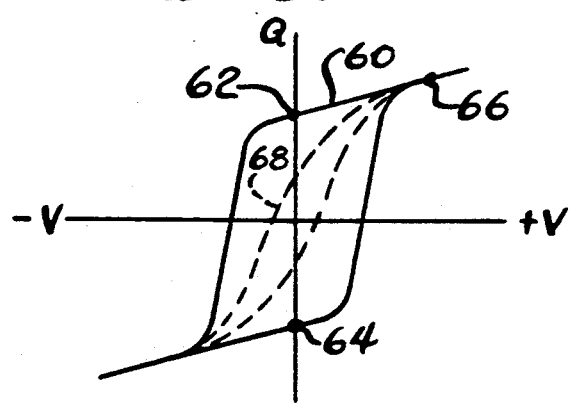
FIG. 3 shows two hysteresis curves, a solid line curve for ferroelectric material in a normal condition and a broken line curve for a relaxed condition.

One plate of the capacitor is held to a fixed potential, such as ground, in the preferred embodiment. Assuming that capacitor plate 44 is held to ground potential, then for a given supply voltage, only one side of the hysteresis loop will be used. It is relatively convenient to ground plate 44 because it is common to a number of DRAM cells in the array, whereas plate 40 is unique to each cell. FIG. 3 shows a hysteresis loop (solid line) for a ferroelectric material of the type which can be used in the present invention. Referring to FIG. 3, the ordinate represents charge and accordingly is marked Q, and the abscissa represents voltage and accordingly is marked V. Two hysteresis curves are represented on these axes, and because one of the capacitor plates is grounded, only the portion of the curves on the positive side of the ordinate will be put to use.

In an ideal ferroelectric, as voltage is applied, the charge developed on the capacitor using the ferroelectric as dielectric would be determined in accordance with the slope of line 60, which would represent the dielectric constant of the ferroelectric material. It can parenthetically be noted that point 62 represents one stable polarization state of the hysteresis curve and point 64 represents the other stable state, both with zero volts applied. These points represent logic states which can be stored by the memory cell if the ferroelectric property of the dielectric is being used to determine the state of the cell. However, the present invention does not rely on stable ferroelectric polarization states to determine data stored in a cell. It uses charge stored on capacitor plates.

In any event, a voltage is applied across the capacitor plates, and charge is thereby stored. As soon as the voltage is removed, the charge begins to dissipate, just as in all DRAM cells of the one transistor, one capacitor type. As a result, like other DRAMS, the memory cell is periodically refreshed. That is to say, the data is read and then rewritten into the cell.

By using ferroelectric materials in such a way that after the switching voltage is applied and then removed, relaxation is encouraged rather than discouraged, then when the cell is refreshed (typically every 4 msec.), the relaxed dipoles will reorient themselves in a manner consistent with the voltage corresponding to point 66 in FIG. 3. The broken line curve 68 in FIG. 3 shows a hysteresis loop for a ferroelectric material with significant relaxation. The result of reorienting the dipoles during refresh is that substantially more charge is developed on the capacitor plates than would be indicated by the dielectric constant multiplied by the applied voltage. For example, if bit line 50 is precharged to 2.5 volts and then coupled to the capacitor by applying voltage to gate electrode 46, the voltage at the memory cell would be either zero or 5 volts from the last write operation (assuming no decay). The voltages will then tend to equalize. In order for the 5 volts in the cell capacitor to equalize with the 2.5 volts on the bit line, numerous dipoles in the ferroelectric material relax, and charge is transferred. If, on the other hand, there is zero volts in the cell, charge is again transferred as relaxed dipoles switch back. The 2.5 volts on the bit line tends to equalize with the zero volts in the cell capacitor, and as the dipoles in the ferroelectric material switch, charge is drawn out of the bit line. When each dipole flips, some unit of charge is moved. This flipping and subsequent relaxation of dipoles occurs even though only a single polarity pulse is applied to the capacitor plate. It will be understood that a logic zero is written into the memory cell by bringing the bit line to ground and transferring zero volts to the capacitor via the access transistor (turned on). A logic one is written with a supply voltage, such as 5 volts, transferred to the cell.

Typically, the more times that a ferroelectric material is written or pulsed in the same direction (i.e. polarity), the less and less becomes the relaxation after each iteration. The reason for this is that compensation charge, as explained in the above-referenced co-pending patent application for "Ferroelectric Retention Method" (Attorney Docket RAM 309), eventually is moved so that relaxation is dissuaded. Thus, to overcome this progressive degradation which would occur with normal ferroelectric materials employed in the manner described above, consideration is now given to ferroelectric dipole domains. These are areas or regions wherein all or substantially all of the dipoles are in the same direction. In some ferroelectric materials, the relaxation will be 180° from the prior orientation (which is aligned with the electric field between the capacitor plates created when voltage is externally applied thereto). However, in other ferroelectric materials, the relaxation is not 180°, and indeed there are some ferroelectric materials where the relaxation is 90°. In such materials, when a 5 volt signal, for example, is applied, the dipoles are all aligned in one direction. When the signal is removed and the 5 volt begins to decay toward zero volts, the dipoles relax to some intermediate position. If a negative 5 volt signal is applied, the dipoles align 180° from the orientation they would have at plus 5 volts. Again, when the signal is removed and relaxed to zero, the dipoles tend to relax to the midpoint orientation again.

This results from the physical structure of the material, i.e., the molecular orientation within the material, and is due to the stresses applied in the material during processing. Conceptually, by using a ferroelectric material with a 90° domain relative to the capacitor plate fields, for example, the dipoles will relax to the position of least stress after voltage is removed from the capacitor plates. More charge is then drawn from the bit line and put on the capacitor plate than would be necessary had there been no relaxation, as with silicon dioxide. Consequently, more charge per unit area is transferred.

Some ferroelectric materials have a molecular structure where there is a "long axis" and a "short axis." The long axis is frequently called the "polar axis." By insuring that the polar axis is in the plane of the ferroelectric film between the capacitor plates, then when a voltage is put on the plates, the polar axis will align in the direction of the resulting electric field, and will nominally be perpendicular to the planes of the capacitor plates.

According to a preferred aspect of the present invention, the polar axis of the ferroelectric material (with no voltage applied) is not aligned with the field which results when voltage is applied to the capacitor plates. Preferably, the polar axis is oriented 90° from the field. When the field is applied, the polar axis moves into a stress position, and when the field is removed, the molecule moves back to a less stressful, more stable position. Preferably polycrystalline or ceramic structure is used for the ferroelectric material between the capacitor plates. Polycrystalline structure is prevalent in the ferroelectric material called PZT, which is lead zirconium titanate. Illustratively, the material uses a ratio of 52 to 48 parts of titanium to zirconium in the following compound: $Pb(Ti,Zr)O_3$. Since PZT normally is created in polycrystalline form, which results from sputtering or evaporating, those persons ordinarily skilled in the art will have no difficulty in providing the preferred ferroelectric material. Further reference is provided in *Non-Metallic Solids* (Academic Press 1971), edited by Roberts and Popper, and particularly Volume 3 thereof entitled *Piezoelectric Ceramics* by B. Jaffee, W. R. Cook, and H. Jaffe, pp 76-79, 154-159. It may be noted that "slanted" as opposed to "square" hysteresis loops are preferred for this invention, which were obtained using additives causing o-position vacancies (see p. 158). Persons skilled in the art sometimes refer to "hard" and "soft" ferroelectrics. The "hard" ones are preferred for use in the present invention because they relax significantly, unlike "soft" ferroelectrics which do not relax and have squarer hysteresis loops.

Generally, most ferroelectric perovskites of the general formula $ABO_3$ will work. Perovskites have a generally cubic structure with "A" atoms at the eight corners of the cube, an oxygen atom in the middle of each of the six faces of the cube, and one "B" atom in the center of the cube. Perovskites include lead zirconium titanate, strontium titanate, and barium titanate.

The structure of the material used can be determined by x-ray diffraction and transmission electron microscopy techniques that have been commonplace in the semiconductor industry for many years. Various factors in modifying the structure include anneal times, temperatures, and ambient atmospheres, as well as the crystal structure of electrodes and substrate coefficients and thermal expansion. It will be understood that because of the polycrystalline structure in the preferred embodiment, the domains will not be uniformly oriented. As long as some of the domains are not parallel (aligned) with the field which results when a voltage is applied to the capacitor plates 40, 44, the present invention works. But it is preferred to have as many domains contra-aligned as possible, as set forth supra.

According to calculations, if a ferroelectric film of 250 angstroms thickness were used, and 10 microcoulombs per square centimeter of the ferroelectric were to relax (this being only about one-fourth of all the ferroelectric dipoles), then using 3.8 as the dielectric constant for silicon dioxide, the improvement gained by using the present invention is a factor of 337 times more charge per unit area.

Thus, by using ferroelectric material as a capacitor dielectric in a DRAM memory cell and conditioning that material to promote relaxation, during normal read, refresh and write operations of the cell, one can expect the need to reorient dipoles in the ferroelectric material each time a read or refresh pulse is applied. The net effect of this is that more charge will be drawn by the memory cell from the bit line per unit area, giving rise to additional signal margin. In this way, the memory cell can be said to be "charge magnified." It will be appreciated that this is achieved by using a ferroelectric material and by orienting the dipoles in a relaxed position different from (and preferably perpendicular to) the electric field applied by capacitor plates. Polycrystalline ferroelectric materials and perovskites exhibit this characteristic and are preferred.

It will be appreciated that the present description is meant to be illustrative and that various modifications may be made consistent with, and within the scope of, the present invention.

I claim:

1. An integrated circuit DRAM comprising:

a plurality of arrayed volatile memory cells which are refreshed from time to time, each volatile memory cell being coupled to a bit line in an array, the cell having an access transistor coupled to the bit line and one capacitor coupled to said access transistor, the one capacitor consisting essentially of two capacitor plates and dielectric material between said plates, one plate being coupled to the transistor, the transistor being switched ON for reading and refreshing the memory cell, the data stored by the memory cell corresponding to the voltage stored on a capacitor plates, said dielectric comprising a ferroelectric material having a high dielectric constant and a plurality of dipoles therein, said dipoles having polar axes of controllable orientation, said ferroelectric material having a configuration such that some of said polar axes have a relaxed first orientation when no voltage exists across said plates, said dipoles being controlled to have a second orientation when a voltage exists between said capacitor plates, said voltage being caused by either a read voltage applied via the bit line and the access transistor or by the storage of charge on said capacitor plates to represent a logic ONE or a logic ZERO, said relaxed first orientation differing from said second orientation, so that repeated reading of the memory cell causes said polar axes to move repeatedly between said relaxed first orientation and said second orientation resulting in an additional charge on the capacitor, regardless of whether the stored data is a logic ONE or a logic ZERO, said configuration being such that despite said repeated reading, said polar axes return to said relaxed first orientation when no voltage exists between said capacitor plates.

2. The improvement of claim 1 wherein said ferroelectric material is polycrystalline in structure.

3. The improvement of claim 2 wherein the ferroelectric material includes lead, zirconium and titanium.

4. The improvement of claim 2 wherein the ferroelectric material includes a perovskite.

5. The DRAM of claim 1 wherein said relaxed, first orientation is substantially 90 degrees from said second orientation.

6. The DRAM of claim 5 wherein said ferroelectric material is polycrystalline in structure and comprises a perovskite.

7. The DRAM of claim 1 wherein said relaxed, first orientation is parallel to the plane of one of said capacitor plates.

8. A method of operating a volatile DRAM integrated circuit having a plurality of volatile memory cells configured in an array in the DRAM, each said memory cell having capacitor plates and a ferroelectric material having dipoles of controllable orientation located between said capacitor plates in each cell, the memory cell being located in said array of memory cells and having a bit line coupled to a plurality of memory cells in the array, the method comprising the steps of:

storing charge on the capacitor plates to represent data to be stored in the cell, thereby storing a first voltage for a LOGIC ONE and a second voltage for a LOGIC ZERO in the cell; and repeatedly causing relaxation of polar axes of the ferroelectric material to a first orientation and return to a second orientation different from said first orientation by repeatedly reading/refreshing the cell, thereby causing the bit line voltage to provide or receive extra voltage caused by the change in orientation of said polar axes with each reading/refreshing.

9. An integrated circuit DRAM comprising:

a plurality of arrayed volatile memory cells which are refreshed from time to time, each volatile memory cell being coupled to a bit line in an array, the cell having an access transistor coupled to the bit line and one capacitor coupled to said access transistor, the one capacitor consisting essentially of two capacitor plates and dielectric material between said plates, one plate being coupled to the transistor, the transistor being switched ON for reading and refreshing the memory cell, the data stored by the memory cell corresponding to the voltage stored on the capacitor plates, said dielectric comprising a ferroelectric material having a high dielectric constant and a plurality of dipoles therein, said dipoles having polar axes of controllable orientation, said ferroelectric material having a configuration such that some of said polar axes have a relaxed first orientation, which is at an angle to an electric field, when no voltage exists across said plates, said dipoles being controlled to have a second orientation, which is parallel to said electric field, when a voltage exists between said capacitor plates, said voltage being caused by either a read voltage applied via the bit line and the access transistor or by the storage of charge on said capacitor plates to represent a logic ONE or a logic ZERO, said relaxed first orientation differing from said second orientation, so that repeated reading of the memory cell causes said polar axes to move repeatedly between said relaxed first orientation and said second orientation resulting in an additional charge on the capacitor, regardless of whether the stored data is a logic ONE or a logic ZERO, said configuration being such that despite said repeated reading, said polar axes return to said relaxed first orientation when no voltage exists between said capacitor plates.

* * * * *